United States Patent
Chen et al.

(10) Patent No.: US 7,605,735 B2
(45) Date of Patent: Oct. 20, 2009

(54) DIGITAL-TO-ANALOG CONVERTER WITH R-2R LADDER NETWORK BY POLARITY CONTROL

(75) Inventors: Ying-Lieh Chen, Sinshih Township, Tainan County (TW); Chien-Ru Chen, Sinshih Township, Tainan County (TW); Chuan-Che Lee, Sinshih Township, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 0 days.

(21) Appl. No.: 11/951,316

(22) Filed: Dec. 5, 2007

(65) Prior Publication Data

US 2009/0146856 A1  Jun. 11, 2009

(51) Int. Cl.
*H03M 1/78* (2006.01)
(52) U.S. Cl. .................................. 341/154; 341/144
(58) Field of Classification Search ................. 341/144, 341/154
See application file for complete search history.

(56) References Cited

U.S. PATENT DOCUMENTS

| | | | | |
|---|---|---|---|---|
| 4,381,499 A | * | 4/1983 | Struthoff | 341/118 |
| 4,891,645 A | * | 1/1990 | Lewis et al. | 341/154 |
| 5,455,582 A | * | 10/1995 | Valdenaire | 341/154 |
| 5,726,652 A | * | 3/1998 | Giuroiu | 341/154 |
| 5,841,382 A | * | 11/1998 | Walden et al. | 341/120 |
| 6,002,354 A | * | 12/1999 | Itoh et al. | 341/144 |
| 6,215,431 B1 | * | 4/2001 | Sheng et al. | 341/144 |
| 6,304,199 B1 | * | 10/2001 | Fang et al. | 341/118 |
| 6,433,719 B2 | * | 8/2002 | Yoon | 341/144 |
| 6,937,178 B1 | * | 8/2005 | Rempfer et al. | 341/154 |
| 7,088,274 B2 | * | 8/2006 | Shill | 341/144 |
| 7,129,878 B1 | * | 10/2006 | Shiu et al. | 341/154 |
| 7,280,063 B2 | * | 10/2007 | Ozalevli et al. | 341/144 |
| 2001/0038351 A1 | * | 11/2001 | Brunolli et al. | 341/154 |

* cited by examiner

*Primary Examiner*—Jean B Jeanglaude
(74) *Attorney, Agent, or Firm*—Stout, Uxa, Buyan & Mullins, LLP

(57) ABSTRACT

A digital-to-analog converter (DAC) includes an R-2R ladder network, switches, and an operation amplifier (OP) with a feedback resistance, for providing an analog voltage in a positive polarity and a negative polarity. Each of the switches is switched between a connection to the OP and the reference voltage.

15 Claims, 3 Drawing Sheets

DIGITAL-TO-ANALOG CONVERTER WITH R-2R LADDER NETWORK BY POLARITY CONTROL

BACKGROUND OF THE PRESENT INVENTION

1. Field of Invention

The present invention relates to a D/A Converter (digital-to-analog converter), more particularly to a D/A Converter for the display driver.

2. Description of Related Arts

For the conventional gamma voltage generator for the display driver of an LCD, a resister string is used. And in the display driver, there are multiple decoders for selecting the needed gamma voltages. The resister string and the decoders occupy a lot of area, and, therefore, there is a need to provide a new design to reduce the area of the gamma voltage generator.

SUMMARY OF THE PRESENT INVENTION

The objective of the present invention is to reduce the area of a gamma voltage generator.

An digital-to-analog converter for converting a digital signal into an analog voltage corresponding to a polarity signal, comprising: an operational amplifier having a first input node, a second input node and a output node for outputting the analog voltage, wherein the second input node receives a reference voltage; and an R-2R ladder network having a first node, a second node and a third node, the first node connected to the first input node of the operational amplifier, the second node receiving a reference voltage, and the third node selectively connected to a first voltage or a second voltage corresponding to the polarity signal, wherein the R-2R ladder network further comprises: a plurality of first resistors connected with a plurality of second resistors, said first resistors having a first resistance, and a said plurality of second resistors with having a second resistance, said second resistance is having a double value of said first resistance; and a plurality of switches respectively connecting the corresponding second resistors to the first input node of the operational amplifier, or to the reference voltage selectively, controlled by the digital signal.

Another applied circuit structure of digital-to-analog converter for converting a digital signal into an analog voltage corresponding to a polarity signal, comprising: an operational amplifier having a first input node, a second input node and a output node for outputting the analog voltage, wherein the second input node receives a reference voltage; an R-2R ladder network having a first node, a second node and a third node, the first node connected to the first input node of the operational amplifier, the second node receiving a reference voltage, and the third node selectively connected to a first voltage or a second voltage corresponding to the polarity signal, wherein the R-2R ladder network further comprises: a plurality of first resistors connected with a plurality of second resistors, the first resistor having a first resistance and a plurality of second resistors with a second resistance, said second resistance is having a double value of said first resistance; and a plurality of switches respectively connecting the corresponding second resistors to the first input node of the operational amplifier, or to the reference voltage selectively, controlled by the LSB of the digital signal; and a thermometer-type circuit for processing the MSB of the digital signal, comprising: a reference current generator for generating a reference current based on the polarity signal; a plurality of transistors for generating the reference current; and a plurality of switches selectively connecting the transistors to the operational amplifier or the reference voltage, controlled by the MSB of the digital signal.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

DETAILED DESCRIPTION OF THE PREFERRED EMBODIMENTS

Figure 1:
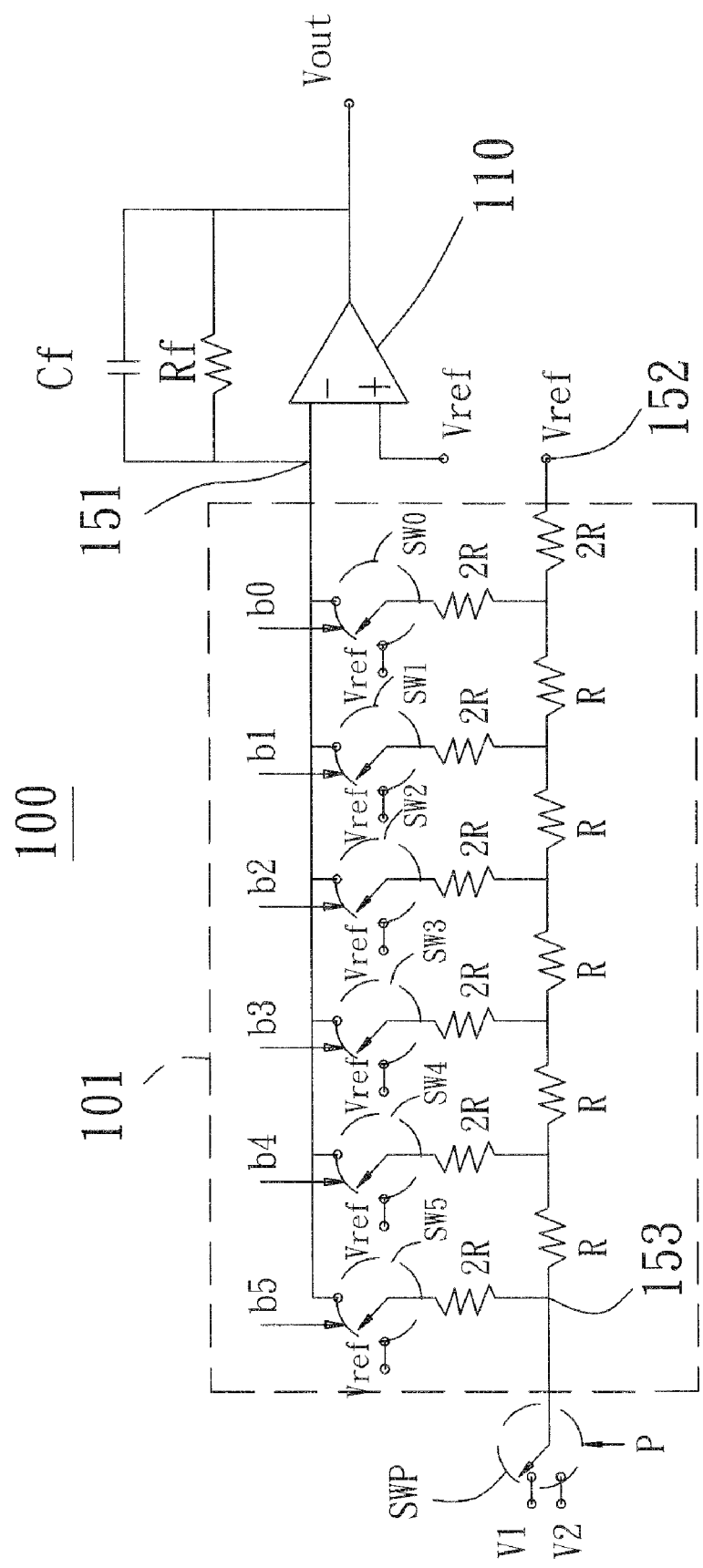
FIG. 1 illustrates an embodiment of a D/A Converter of the present invention.

Referring to FIG. 1, it is an embodiment of an n-bit digital-to-analog converter (DAC) with a R-2R ladder network. The DAC 100 in this embodiment is exemplified as a 6-bit DAC for converting a digital signal [b5 . . . b0] into an analog voltage Vout, based on a polarity signal P. The DAC 100 includes an operational amplifier 110, and a R-2R ladder network 101. The operational amplifier 110 has a first input node, a second input node and an output node for outputting the analog voltage. The DAC 100 also includes a resistor Rf connected between the first input node and output node of the operational amplifier 110. Further, the DAC 100 may optionally include a capacitor Cf connected with the resistor Rf in parallel. The second input node receives a reference voltage Vref. The first input node of the operational amplifier is an inverting input node, and the second input node of the operational amplifier is a non-inverting input node.

The R-2R ladder network 101 (inside an electric equipment's circuit) has a first node 151, a second node 152 and a third node 153. The first node 151 is connected to the first input node of the operational amplifier 110, the second node 151 receives the reference voltage Vref, and the third node 153 is selectively connected to a first voltage V1 or a second voltage V2 via a switch SWP corresponding to the polarity signal P. In one embodiment, the first voltage V1 is the power voltage VDD minus a threshold voltage, and the second voltage V2 is the ground voltage VSS plus a threshold voltage. The threshold is 0.3V for example.

The R-2R ladder network 101 further comprises a plurality of first resistors with a first resistance, denoted as R, and a plurality of second resistors with a second resistance, denoted as 2R. The plurality of first resistors connects with the plurality of corresponding second resistors. The second resistance is the double of the first resistance.

The plurality of switches SW0-SW5, controlled by the digital signal [b5 . . . b0], selectively connect the corresponding second resistors to the first node of the operational amplifier 110 or the reference voltage Vref.

Figure 2:
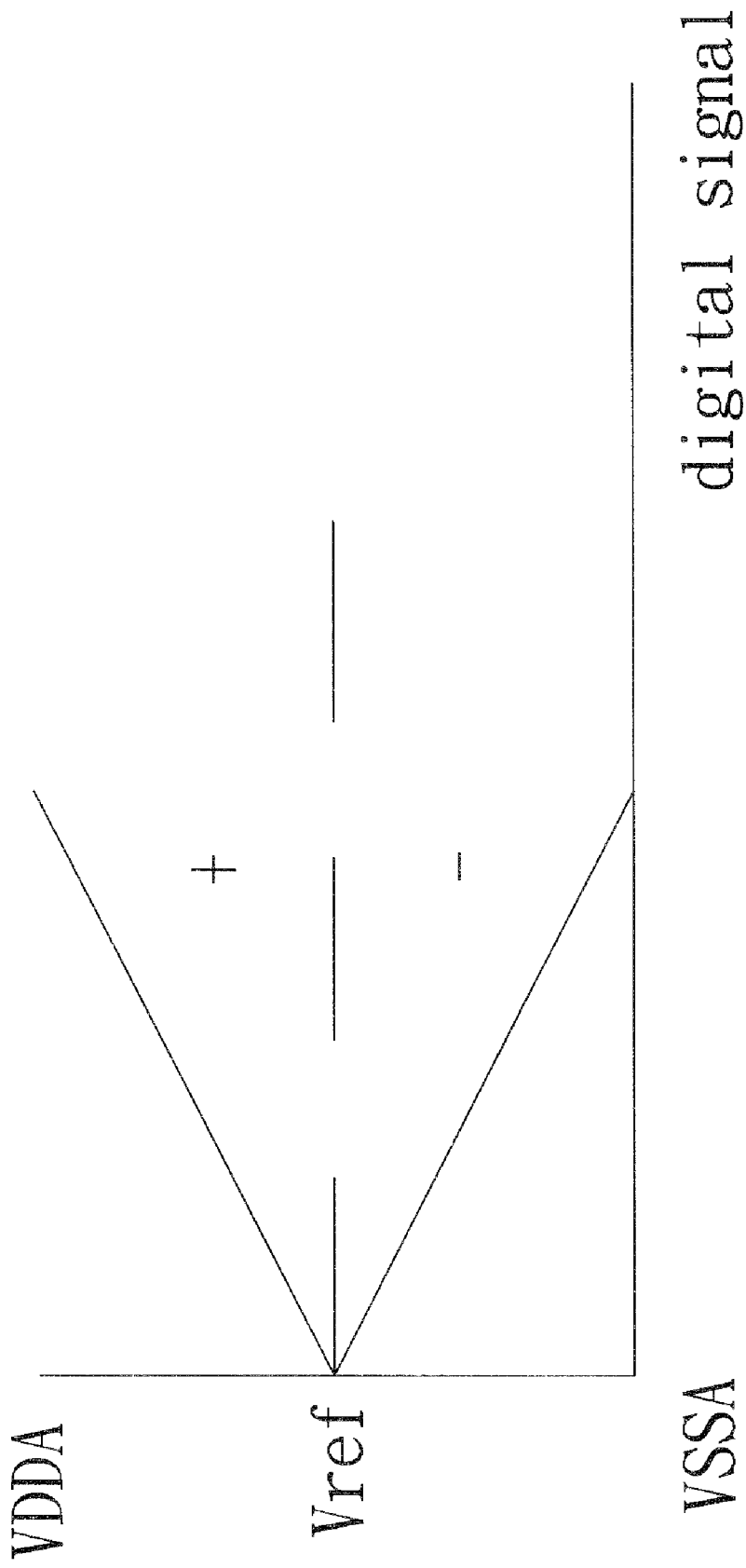
FIG. 2 illustrates the relation of the input voltages and the output voltages.

FIG. 2 is a diagram of the input of the DAC versus the output of the DAC. While an output with a positive polarity is required, the DAC 100 outputs the analog voltage Vout in the range from VDD to Vref. While an output with a negative polarity is required, the DAC 100 outputs the analog Vout in the range from Vref to VSSA. Specifically, while an output with the negative polarity is required, the switch SWP connects the R-2R ladder network 101 to the first voltage V1, such that the output of the DAC 100 is:

$$Vout = Vref - (V1 - Vref)\left(\frac{Rf}{R}\right)\sum_{i=0}^{i=5} \frac{b_i}{2^{6-i}},$$

which has a negative polarity since V1 is the power voltage VDDA minus the threshold, and the reference voltage Vref is the average of the power voltage VDDA and the ground voltage VSS. While an output with a positive polarity is required, the switch SWP connects the R-2R ladder network 101 to the second voltage V2, such that the output of the DAC 100 is:

$$Vout = Vref - (V2 - Vref)\left(\frac{Rf}{R}\right)\sum_{i=0}^{i=5} \frac{b_i}{2^{6-i}},$$

which has a positive polarity since V2 is the ground voltage VSSA plus the threshold voltage.

Figure 3:
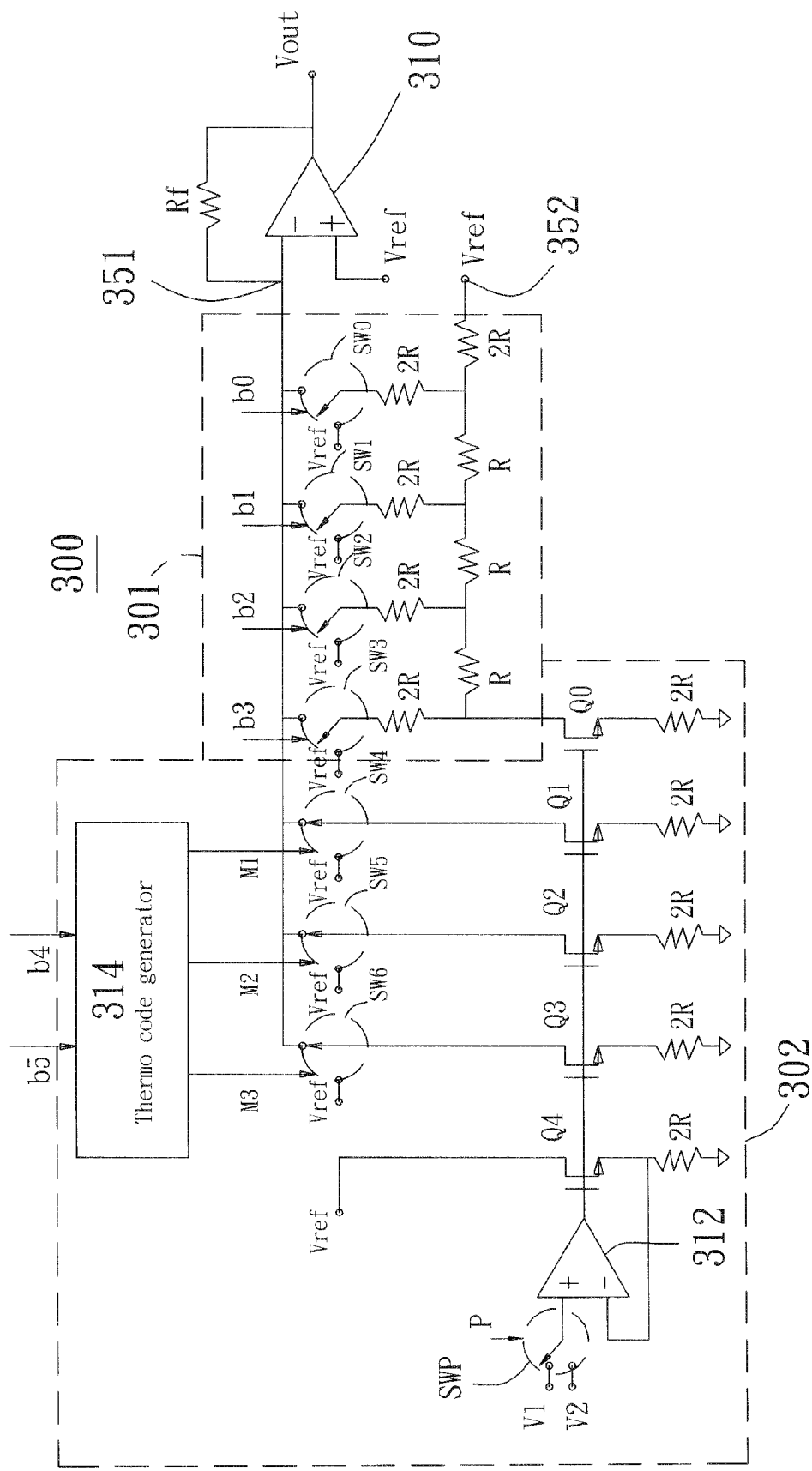
FIG. 3 illustrates the other embodiment of a D/A Converter of the present invention.

FIG. 3 is showing a circuit diagram of a DAC according to a second embodiment of the invention. The DAC 300 includes an operational amplifier 310, a R-2R ladder network 301 for processing the LSB (least significant bits) of the digital signal, and a thermometer-type circuit 302 for processing the MSB (most significant bits) of the digital signal. In this embodiment, the LSB of the digital signal is [b3 . . . b0], and the MSB of the digital signal is [b5, b4].

The operational amplifier 310 has a first input node 351, a second input node 352 and a output node for outputting the analog voltage Vout. The DAC 300 also includes a resistor Rf connected between the first input node and output node of the operational amplifier 310. Further, the DAC 300 may optionally include a capacitor connected with the resistor Rf in parallel. The second input node of the operational amplifier 310 receives a reference voltage Vref. The first input node of the operational amplifier 310 is an inverting input node, and the second input node of the operational amplifier 310 is a non-inverting input node.

The R-2R ladder network 301 is connected to the first input node of the operational amplifier 310. The R-2R ladder network 301 includes a plurality of first resistors with a first resistance, denoted as R, and a plurality of second resistors with a second resistance, denoted as 2R. The second resistance has the double value of the first resistance. The plurality of first resistors connects with the plurality of corresponding second resistors.

The plurality of switches SW0-SW3, controlled by the digital signal [b3 . . . b0], selectively connect the corresponding second resistors to the first node of the operational amplifier 310 or the reference voltage Vref.

The thermometer-type circuit 302 includes transistors Q0-Q4, switches SW4-SW6, a buffer 312 and a thermo code generator 314. The first input of the buffer 312 selectively receives a first voltage V1 or a, second voltage V2 via the switch SWP controlled by a polarity signal P, and the output of the buffer 312 controls the gates of the transistors Q0-Q4. The transistors Q0-Q4 respectively connects to resistors, each having the resistance of 2R. The transistor Q4 is used as a reference current generator selectively controlled by the first voltage V1 or the second voltage V2 via the polarity switch SWP to generate a reference current such that the current flow through each of the transistors Q0-Q3 is constant.

The thermo code generator 314 generates codes M1, M2 and M3 according to the MSB of the digital signal [b5, b4]. While [b5,b4]=[0,1], M1 is asserted; while [b5,b4]=[1,0], M1 and M2 are asserted; while [b5,b4]=[1,1], M1, M2 and M3 are asserted. The switches SW4-SW6 are respectively controlled by the codes M1-M3 for selectively connects the transistors Q1-Q3 to the first input node of the operational amplifier 310, or to the reference voltage Vref.

Specifically, suppose the current through the switch SW0 is I, then the currents through the switches SW1, SW2, SW3 are respectively 2I, 4I, and 8I, such that the current through transistor Q0 is 16I. Since the currents respectively through transistors Q0-Q4 should be the same, the current through each of transistors Q0-Q4 is 16I. For a digital signal [011000], the code M1 is asserted and the switch SW3 connects the corresponding second resistor to the operational amplifier 310, such that the current through the resistor Rf is 16I+ 8I=24I, and then Vout can be generated correspondingly.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

One skilled in the art will understand that the embodiment of the present invention as shown in the drawings and described above is exemplary only and not intended to be limiting.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implemenion contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A digital-to-analog converter for converting a digital signal into an analog voltage corresponding to a polarity signal, comprising:

an operational amplifier having a first input node, a second input node and an output node for outputting the analog voltage, wherein the second input node receives a reference voltage;

an R-2R ladder network having a R-2R output node, a reference node and an input node, the R-2R output node connected to the first input node of the operational amplifier, the reference node receiving a reference voltage, and the input node receiving an input voltage, wherein the R-2R ladder network further comprises:

a plurality of first resistors connected with a plurality of second resistors, said first resistors having a first resistance, and said second resistors having a second resistance, said second resistance having a double value of said first resistance; and a plurality of switches selectively connecting the corresponding second resistors to the first input node of the operational amplifier, or to the reference voltage selectively, controlled by the digital signal; and a polarity switch electrically connected to said input node of said R-2R network, selectively switching between a first input voltage and a second input voltage corresponding to the polarity signal, and outputting to said input node of said R-2R network.

2. The digital-to-analog converter of claim 1, further comprising a third resistor connected between the output node and the first input node of the operational amplifier.

3. The digital-to-analog converter of claim 2, further comprising a capacitor connected with the third resistor in parallel.

4. The digital-to-analog converter of claim 1, wherein the first input node of the operational amplifier is an inverting input node, and the second input node of the operational amplifier is a non-inverting input node.

5. The digital-to-analog converter of claim 1, wherein the reference voltage is between the first voltage and the second voltage.

6. The digital-to-analog converter of claim 1, wherein the reference voltage is the average of the first voltage and the second voltage.

7. The digital-to-analog converter of claim 1, wherein the first voltage is a power voltage minus a threshold voltage, and the second voltage is a ground voltage plus the threshold voltage.

8. A digital-to-analog converter for converting a digital signal into an analog voltage corresponding to a polarity signal, comprising:

an operational amplifier having a first input node, a second input node and an output node for outputting the analog voltage, wherein the second input node receives a reference voltage;

a R-2R ladder network having a R-2R-output node, a reference node and an input node, the R-2R-output node connected to the first input node of the operational amplifier, the reference node receiving a reference voltage, and the input node receiving an input voltage; and a polarity switch electrically connected to said input node of said R-2R network, selectively switching between a first input voltage and a second input voltage corresponding to the polarity signal, and outputting to said input node of said R-2R network;

wherein the R-2R ladder network further comprises:

a plurality of first resistors connected with a plurality of second resistors, the first resistor having a first resistance and the second resistors having a second resistance, said second resistance having a double value of said first resistance;

a plurality of switches respectively connecting the corresponding second resistors to the first input node of the operational amplifier, or to the reference voltage selectively, controlled by the LSB of the digital signal; and a thermometer-type circuit for processing the MSB of the digital signal, comprising:

a polarity switch selectively electrically connected to a first voltage or a second voltage corresponding to the polarity signal;

a reference current generator for generating a reference current;

a plurality of transistors for generating the reference current; and a plurality of switches selectively connecting the transistors to the operational amplifier or the reference voltage, controlled by the MSB of the digital signal.

9. The digital-to-analog converter of claim 8, further comprising a third resistor connected between the output node and the first input node of the operational amplifier.

10. The digital-to-analog converter of claim 9, further comprising a capacitor connected with the third resistor in parallel.

11. The digital-to-analog converter of claim 8, wherein the first input node of the operational amplifier is an inverting input node, and the second input node of the operational amplifier is a non-inverting input node.

12. The digital-to-analog converter of claim 8, wherein the reference voltage is between the first voltage and the second voltage.

13. The digital-to-analog converter of claim 8, wherein the reference voltage is the average of the first voltage and the second voltage.

14. The digital-to-analog converter of claim 8, wherein the first voltage is a power voltage minus a threshold voltage, and the second voltage is a ground voltage plus the threshold voltage.

15. The digital-to-analog converter of claim 8, wherein the thermometer-type circuit further comprises a thermo code generator for generating codes based on the MSB of the digital signal, and the switches corresponding to the transistors of the thermometer-type circuit are controlled by the codes.

* * * * *